United States Patent [19]
Matano

[11] Patent Number: 6,066,975
[45] Date of Patent: May 23, 2000

[54] LEVEL CONVERTER CIRCUIT

[75] Inventor: Tatsuya Matano, Tokyo, Japan

[73] Assignee: NEC Corporation, Tokyo, Japan

[21] Appl. No.: 09/076,915

[22] Filed: May 13, 1998

[30] Foreign Application Priority Data

May 16, 1997 [JP] Japan ..................................... 9-143319

[51] Int. Cl.$^7$ ................................................... H03L 5/00
[52] U.S. Cl. ............................ 327/333; 327/112; 326/62; 326/80
[58] Field of Search ..................................... 327/333, 108, 327/109, 111, 112, 436, 437; 326/62, 68, 80, 81

[56] References Cited

U.S. PATENT DOCUMENTS

| 5,204,557 | 4/1993 | Nguyen | 326/81 |
| 5,296,757 | 3/1994 | Koizumi | 326/21 |
| 5,493,245 | 2/1996 | Kao et al. | 327/333 |
| 5,510,748 | 4/1996 | Erhart et al. | 327/530 |
| 5,650,742 | 7/1997 | Hirano | 327/318 |
| 5,781,026 | 7/1998 | Chow | 326/26 |

FOREIGN PATENT DOCUMENTS 9-200035  7/1997  Japan.

OTHER PUBLICATIONS

Tadato Yamagata et al., "Circuit Design Techniques for Low–Voltage Operating and/or Giga–Scale DRAMs", pp. 248–249, Digest of Technical Papers, IEEE International Solid–State Circuits Conference, (Feb. 1995).

*Primary Examiner*—Timothy P. Callahan
*Assistant Examiner*—Hai L. Nguyen
*Attorney, Agent, or Firm*—Young & Thompson

[57] ABSTRACT

A voltage level converter circuit having an input section and a driver section. A gate of a driver field effect transistor that is connected to an output terminal is directly driven by an input side field effect transistor that has a gate connected to an input terminal so as to allow the level converter circuit to exhibit high speed logic level conversion operations. The input section includes two series connections of transistors that are variously connected between converted voltages and original voltages.

7 Claims, 9 Drawing Sheets

LEVEL CONVERTER CIRCUIT

BACKGROUND OF THE INVENTION

The present invention relates to a logic level converter circuit and more particularly to a logic level converter circuit for converting high and low logic voltage levels into different high and low logic levels.

A word line driver circuit has been proposed as a level converter circuit which converts high and low logic voltage levels into different high and low logic levels. Such a word line driver circuit is disclosed in ISSCC'95 DIGEST OF TECHNICAL PAPERS "Circuit Design Techniques For Low-Voltage Operating And/Or Giga-Scale DRAMs". FIG. 1 is a circuit diagram illustrative of such the conventional word line driver circuit for converting the high and low logic voltage levels into different high and low logic levels, wherein the HIGH level corresponding to an internal power voltage VINT is converted into a different high voltage level corresponding to a boosting power voltage VPP whilst the LOW level corresponding to the ground level GND is converted into a different low voltage level corresponding to a shallow voltage level VBB.

To reduce a sub-threshold leakage current, a word line voltage is controlled at a negative voltage level in a stand-by state and controlled at a boosting voltage level higher than the internal operation voltage level in an active state.

In the above word line driver circuit, a node A3 is driven by an output from a ROW decoder as a logic gate. It is now considered that the node A3 is indirectly driven by a driver in another block. FIG. 3 is a block diagram illustrative of the other conventional word line driver circuit for converting the high and low logic voltage levels into different high and low logic levels, wherein the node A3 is indirectly driven by a driver in another block. Input waveforms from an inverter D3 of the other block has large rise and fall-times since an input signal from the inverter D3 is transmitted through a load of a line H1 into an input section VIN. For this reason, a transition time of the logic voltage level at the input section VIN is large, whereby a large punch through current I1 flows from the power source VPP through the line H1 and transistors Q2 and Q5 to the ground GND in response to the fall of the voltage level from the inverter D3. In addition, a large punch through current I2 flows from the power source VINT through the line H1 and transistors Q6 and Q4 to the power source VBB in response to the rise of the voltage level from the invertor D3. In order to avoid problems with the large punch through currents, it is preferable that the node A3 is directly driven by the output from the logic gate.

The following description will focus on circuit configurations and operations of the conventional level converter circuit as illustrated in FIG. 2 wherein a node A3 is directly driven by an inverter D2. FIG. 4 is a timing chart illustrative of waveforms of the conventional level converter circuit as illustrated in FIG. 2. The conventional level converter circuit has an input section and a driver section. The driver section of the conventional level converter circuit has p-channel MOS field effect transistors Q1 and Q2 having a substrate voltage VPP as well as has n-channel MOS field effect transistors Q3 and Q4 having a substrate voltage VBB. The input section of the conventional level converter circuit has an n-channel MOS field effect transistor Q5 having a substrate voltage of ground level and a gate which receives a voltage VINT. The input section of the conventional level converter circuit also has a p-channel MOS field effect transistor Q6 having a substrate voltage of VINT and a gate which is applied with a voltage of ground level. The input section of the conventional level converter circuit also has an inverter D2 comprising n-channel and p-channel MOS field effect transistors which have the same size as the n-channel and p-channel MOS field effect transistors Q5 and Q6 respectively.

In the input section, the inverter D2 has an input side connected to an input terminal VIN of the conventional level converter circuit and an output side connected to a node A3. The n-channel MOS field effect transistor Q5 is connected in series between the node A3 and a node A1, whilst the p-channel MOS field effect transistor Q6 is connected in series between the node A3 and a node A2.

First, rising operation of the output voltage VOUT is considered. When the input voltage VIN is in the ground level GND, then the node A3 in the output side of the invertor D2 has the voltage level VINT, whilst the node A2 has the voltage level VINT and the output terminal VOUT has the voltage level VBB. The transistors Q5, Q1 and Q4 are in the non-conductive states or OFF state, whilst the remaining transistors Q6, Q2 and Q3 are in the conductive state or ON state whereby the individual nodes are connected to the power voltages.

When the input voltage VIN rises from the ground level GND to the voltage level VINT, the potential of the node A3 is dropped from the voltage level VINT to the ground level GND. Since at this time the transistor Q6 is in the ON state, then the potential of the node A2 falls to approach an absolute value |VTP| of a negative threshold voltage VTP of the p-channel transistor, whereby the source and drain voltage of the transistor Q6 or the voltage applied across the nodes A2 and A3 is reduced. As a result, the driving ability of the transistor Q6 is dropped and the potential of the node A2 is gradually dropped.

On the other hand, since the potential of the node A3 is dropped to a voltage level defined as a difference of VINT−VTN wherein VTN is a positive threshold voltage of the n-channel MOS field effect transistors, the transistor Q5 turns to a conductive state or ON state, whereby the potential of the node A1 falls. When the potential of the node A1 becomes not higher than a voltage level of VPP−|VTP|, the transistor Q1 turns ON whereby the voltage level of the output VOUT gradually rises because the transistor Q3 has remained in the conductive state or the ON state. Thereafter, when the voltage level of the output terminal VOUT rises to not lower than a voltage level VBB+VTN, then the transistor Q4 turns to the conductive state or the ON state, whereby the potential of the node A2 falls to the voltage level VBB. As a result, the transistors Q3 and Q6 turn to an OFF state or the non-conductive state. At this time, the output voltage VOUT rises to the voltage level VPP and the transistors Q1 and Q5 are in the conductive state or the ON state.

Subsequently, the falling operation of the output voltage VOUT will be considered. When the input voltage VIN is in the voltage level VINT, then the node A3 is in the ground level GND, the node A2 is in the voltage level VBB and the output voltage VOUT is in the voltage level VPP. The transistors Q6, Q2 and Q3 are in the non-conductive state or OFF state whilst the remaining transistors Q5, Q1 and Q4 are in the conductive state or ON state so that the individual nodes are connected to the power voltages.

When the input voltage VIN is dropped from the voltage level VINT to the ground level GND, then the node A3 rises from the ground level GND to the voltage level VINT. Since at this time the transistor Q5 is in the conductive state or ON state, then the node A1 voltage level rises to approach the voltage level defined as VINT−VTN.

Since the source and drain voltage of the transistor Q5 or the voltage applied across the nodes A1 and A3 is reduced, the driving ability of the transistor Q5 drops and the potential of the node A1 gradually rises.

On the other hand, since the potential of the node A3 is risen to a voltage level defined as a difference of |VTP|, the transistor Q6 turns the conductive state or ON state, whereby the potential of the node A2 rises. When the potential of the node A2 becomes not lower than a voltage level of VBB+VTN, the transistor Q3 turns ON whereby the voltage level of the output VOUT is gradually dropped. Thereafter, when the voltage level of the output terminal VOUT is dropped to not higher than a voltage level VPP−|VTP|, then the transistor Q2 turns to the conductive state or the ON state, whereby the potential of the node A1 is risen to the voltage level VPP. As a result, the transistors Q1 and Q5 turn OFF state or the non-conductive state. At this time, the output voltage VOUT is dropped to the voltage level VBB and the transistor Q4 is in the non-conductive state or OFF state and the transistors Q3 and Q6 are in the conductive state or the ON state.

In the above manner as described above, the level converter circuit converts the logic levels, for example, HIGH level: VINT corresponding to the internal power voltage and LOW level: GND corresponding to the ground level into different logic levels, for example, HIGH level: VPP corresponding to the booster power voltage and LOW level: VBB negative low voltage VBB.

In the above conventional level converter circuit, the inverter D2 is operated as an input logic gate on the input section, whilst the transistors Q5 and Q6 are operated as transfer gate transistors for preventing the logic level of the node A3 from being transferred to the voltage level VPP or VBB. On the input section of the above conventional level converter circuit, the output from the input logic gate or the voltage level of the node A3 is transferred through the transfer gate transistors Q5 and Q6 to the nodes A1 and A2 so that those outputs from the transfer gate transistors Q5 and Q6 or the voltage levels of the nodes A1 and A2 are inputted into the driver section.

The above conventional level converter circuit has the following problems.

In the rise operation of the output voltage VOUT, the p-channel MOS field effect transistor Q1 on the driver section is driven by the plural transistors, for example, the n-channel MOS field effect transistor of the invertor D2 acting as the input logic gate on the input section and the n-channel transfer gate MOS field effect transistor Q5 on the input section.

Further, in the fall operation of the output voltage VOUT, the n-channel MOS field effect transistor Q3 on the driver section is driven by the plural transistors, for example, the p-channel MOS field effect transistor of the invertor D2 acting as the input logic gate on the input section and the p-channel transfer gate MOS field effect transistor Q6 on the input section.

Since each of the driver transistors on the driver section is driven by the plural transistors on the input section, the above conventional level converter circuit is incapable of exhibiting high speed logic level conversion operations.

In the above circumstances, it had been required to develop a novel level converter circuit free from the above problems.

SUMMARY OF THE INVENTION

Accordingly, it is an object of the present invention to provide a novel level converter circuit free from the above problems.

It is a further object of the present invention to provide a novel level converter circuit capable of exhibiting high speed logic level conversion operations.

It is a still further object of the present invention to provide a novel level converter circuit, wherein a gate of a driver field effect transistor on a driver section is connected to an output terminal and is directly driven by an input side field effect transistor having a gate connected to an input terminal.

The above and other objects, features and advantages of the present invention will be apparent from the following descriptions.

In accordance with the present invention, a novel level converter circuit having an input section and a driver section is provided wherein a gate of a driver field effect transistor on the driver section is connected to an output terminal, is directly driven by an input side field effect transistor on the input section, and has a gate connected to an input terminal so as to allow the novel level converter circuit to exhibit high speed logic level conversion operations.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
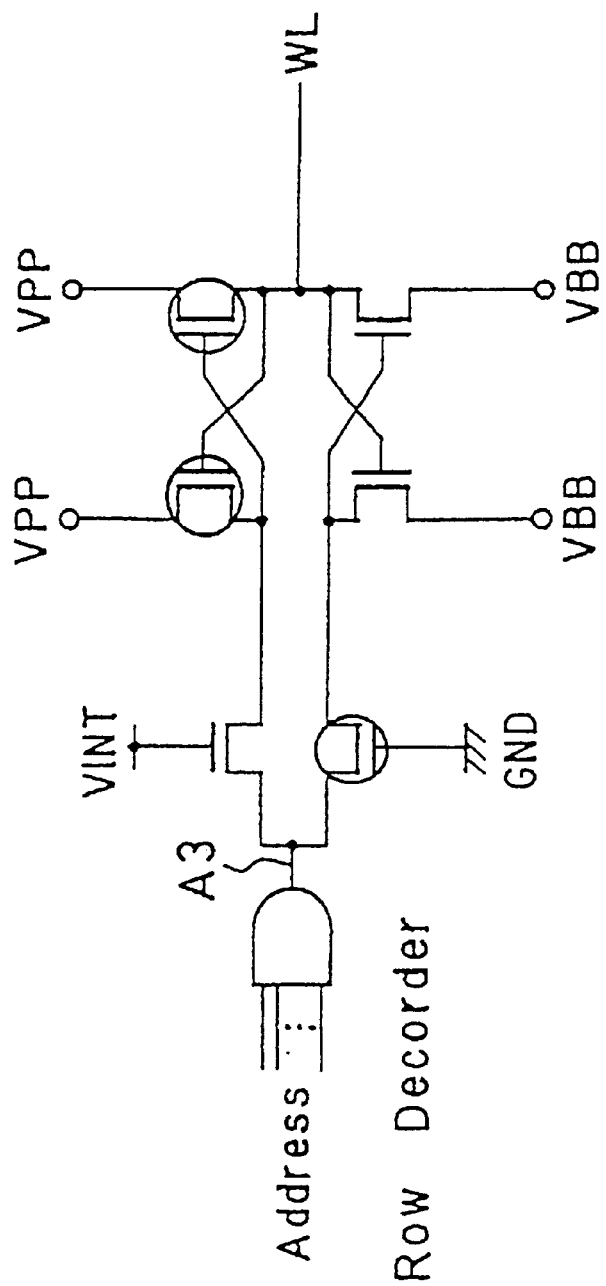
FIG. 1 is a circuit diagram illustrative of such the conventional word line driver circuit for converting the high and low logic voltage levels into different high and low logic levels.
Figure 2:
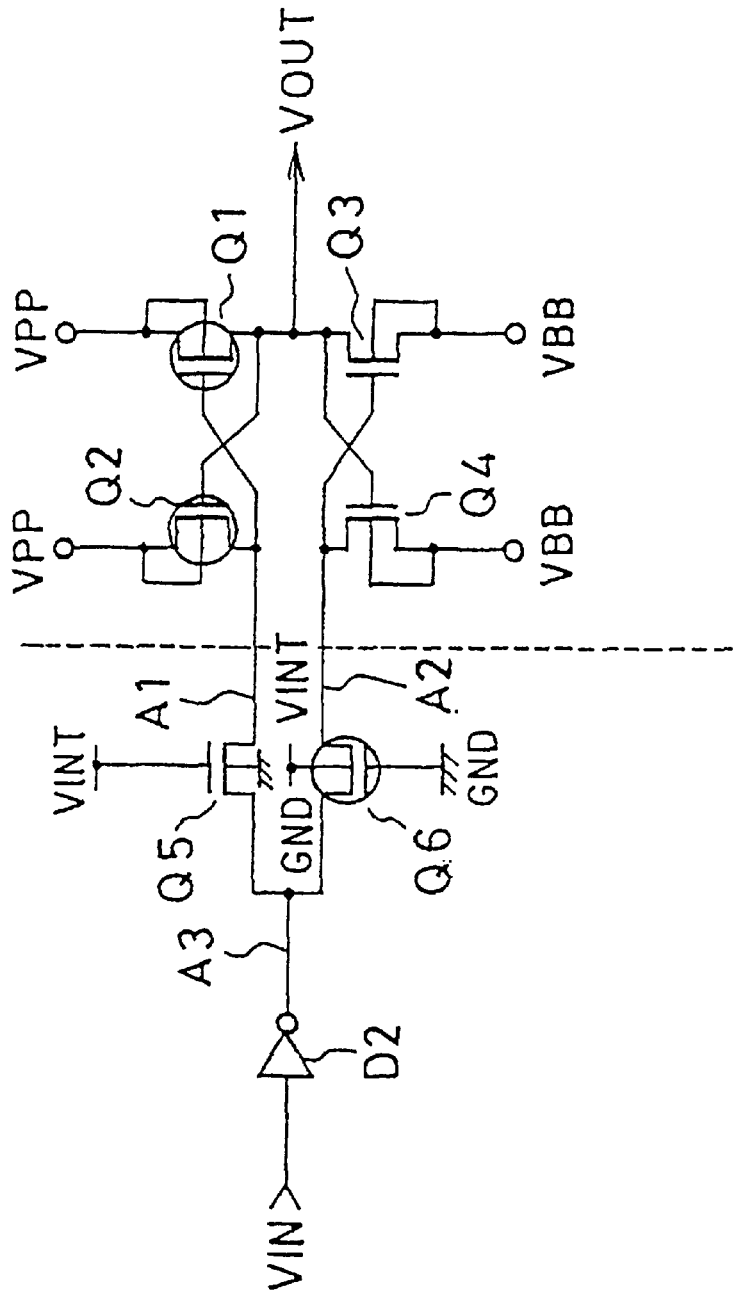
FIG. 2 is a block diagram illustrative of the other conventional word line driver circuit for converting the high and low logic voltage levels into different high and low logic levels, wherein the node A3 is directly driven by inverter D2.
Figure 3:
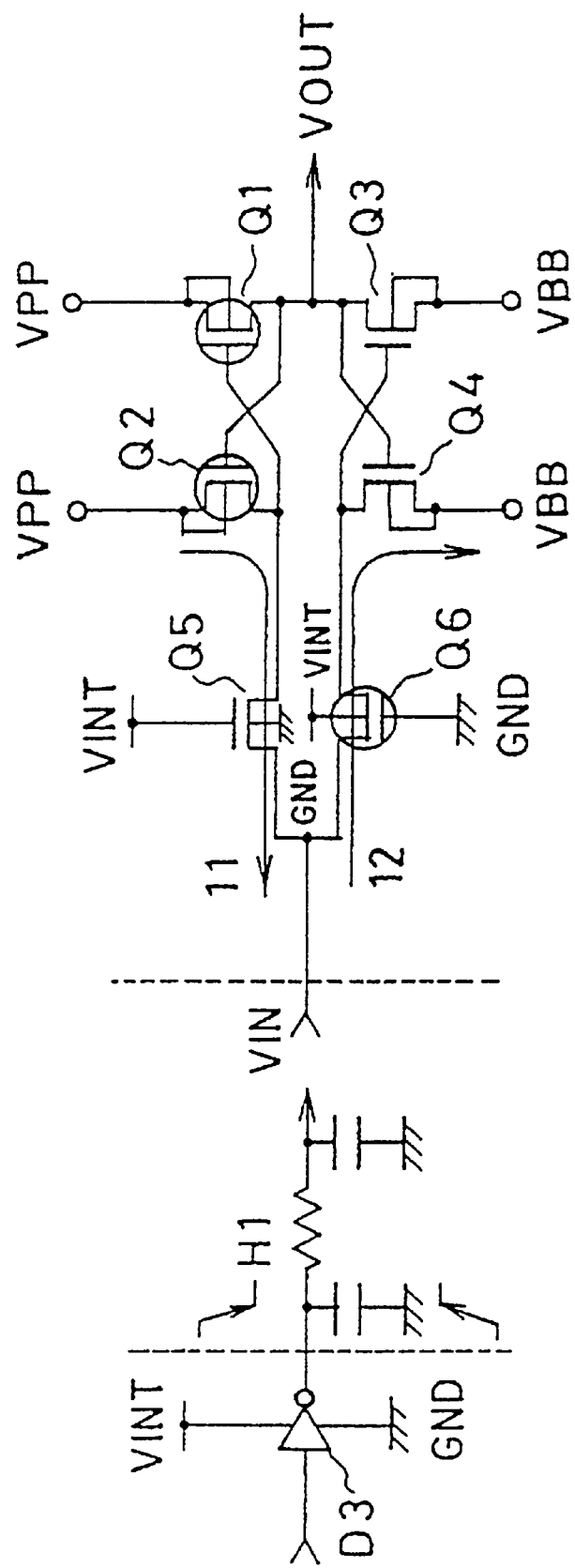
FIG. 3 is a block diagram illustrative of the other conventional word line driver circuit for converting the high and low logic voltage levels into different high and low logic levels, wherein the node A3 is indirectly driven by a driver in another block.
Figure 4:
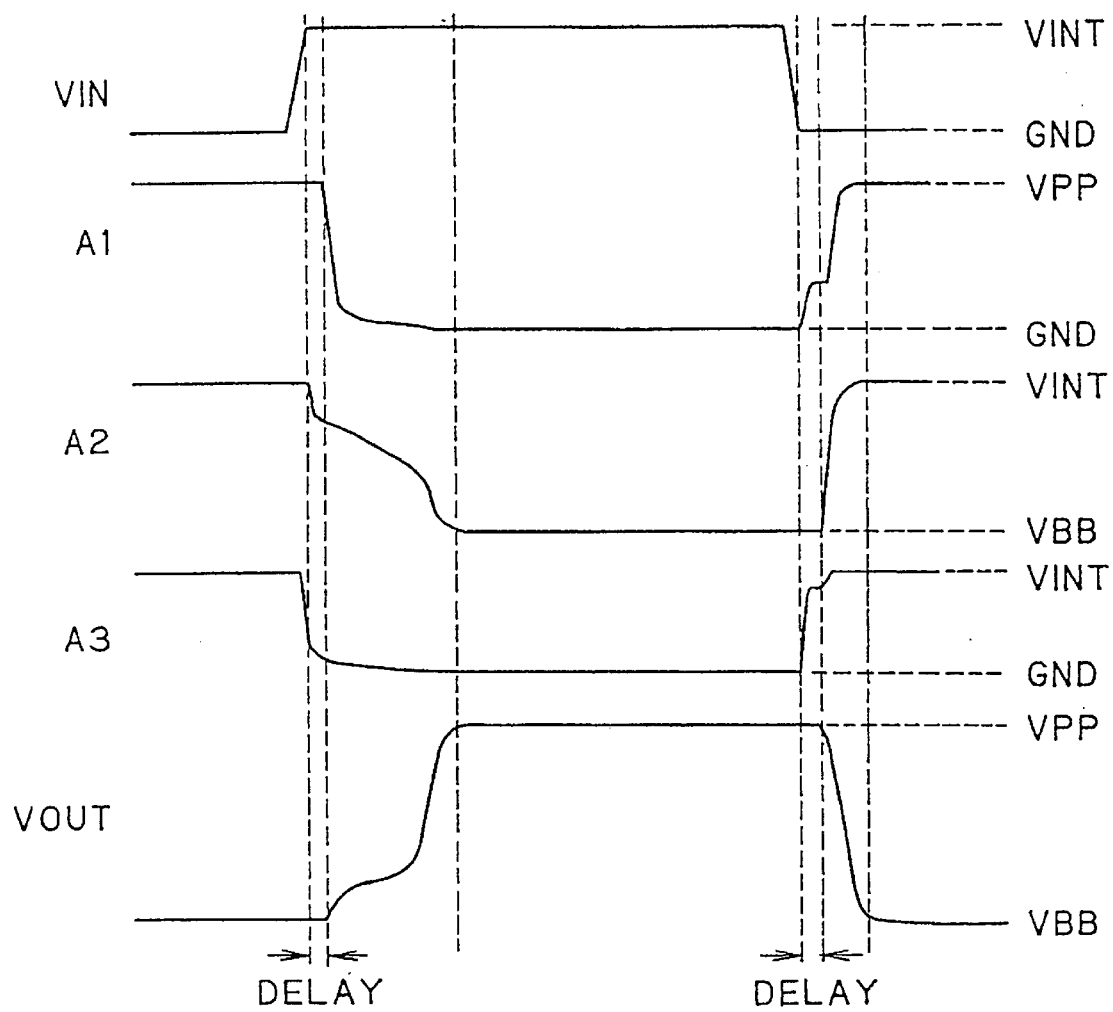
FIG. 4 is a timing chart illustrative of waveforms of the conventional level converter circuit as illustrated in FIG. 2.

The first aspect of the present invention provides a voltage level converter circuit for converting a set of original logic voltage levels into another set of converted voltage levels different from the original voltage levels. The voltage level converter circuit comprises a driver section and an input section connected to the driver section. The driver section has an output terminal from which an input signal is output. The input section has an input terminal into which an input signal is input. The driver section selectively supplies one of the converted voltage levels to the output terminal. The input section controls the driver section to selectively supply one of the converted voltage levels to the output terminal in accordance with the input signal. Gates of driver side transistors in the driver section are directly connected to the output terminal and are connected to input side transistors in the input section. The input side transistors have gates directly connected to the input terminal so that the gates of driver side transistors are directly driven by the input side transistors.

It is preferable that a high level of the converted voltage levels is higher than a high level of the original voltage levels and a low level of the converted voltage levels is lower than a low level of the original voltage levels.

It is also preferable that the input section comprises: an inverter having an input side connected to the input terminal; and series connections of transistors between high and low voltage lines having high and original low voltage levels and having gates connected to the input terminal and an output side of the inverter and the transistors drive the gates of the driver transistors on the driver section.

It is also preferable that the input section comprises: an inverter having an input side connected to the input terminal; a first series connection of transistors being provided between high and low voltage lines having a high converted voltage level and a original low voltage level respectively and having gates connected to the input terminal and an output side of the invertor and the transistors drive the gate of one of the driver transistors on the driver section; and a second series connection of transistors being provided between high and low voltage lines having a original high voltage level and a low converted voltage level respectively and having gates connected to the input terminal and an output side of the invertor and the transistors drive the gate of another of the driver transistors on the driver section.

It is also preferable that the input section comprises: an inverter having an input side connected to the input terminal; a first series connection of transistors being provided between a low voltage line having an original low voltage level and an output side of the inverter and having gates connected to the input terminal and a high voltage line having an original high voltage level and the transistors drive the gate of one of the driver transistors on the driver section; and a second series connection of transistors being provided between a low voltage line having an original high voltage level and the output side of the inverter and having gates connected to the input terminal and a low voltage line having an original low voltage level and the transistors drive the gate of another of the driver transistors on the driver section.

It is also preferable that the input section comprises: a first CMOS inverter between a low voltage line having an original low voltage level and a transistor connected to a high voltage line having an original high voltage and the first CMOS inverter having gates connected to the input terminal and the first CMOS inverter drives the gate of one of the driver transistors on the driver section; and a second CMOS inverter between a high voltage line having an original high voltage level and a transistor connected to a low voltage line having an original low voltage and the second CMOS inverter having gates connected to the input terminal and the second CMOS inverter drives the gate of one of the driver transistors on the driver section.

The second aspect of the present invention provides a circuitry of an input section connected to a driver section in a voltage level converter circuit for converting a set of original logic voltage levels into another set of converted voltage levels different from the voltage levels. The driver section has an output terminal from which an output signal is output. The input section has an input terminal into which an input signal is input. The driver section selectively supplies one of the converted voltage levels to the output terminal. The input section controls the driver section to selectively supply one of the converted voltage levels to the output terminal in accordance with the input signal. Gates of driven side transistors in the driver section are directly connected to the output terminal and are connected to input side transistors in the input section. The input side transistors have gates directly connected to the input terminal so that the gates of driver side transistors are directly driven by the input side transistors.

It is preferable that a high level of the converted voltage levels is higher than a high level of the original voltage levels and a low level of the converted voltage levels is lower than a low level of the original voltage levels.

It is also preferable that the input section comprises: an inverter having an input side connected to the input terminal; and series connections of transistors being provided between high and low voltage lines having high and original low voltage levels and having gates connected to the input terminal and an output side of the inverter and the transistors drive the gates of the driver transistors on the driver section.

It is also preferable that the input section comprises: an inverter having an input side connected to the input terminal; a first series connection of transistors being provided between high and low voltage lines having a high converted voltage level and a original low voltage level respectively and having gates connected to the input terminal and an output side of the invertor and the transistors drive the gate of one of the driver transistors on the driver section; and a second series connection of transistors being provided between high and low voltage lines having a original high voltage level and a low converted voltage level respectively and having gates connected to the input terminal and an output side of the invertor and the transistors drive the gate of another of the driver transistors on the driver section.

It is also preferable that the input section comprises: an inverter having an input side connected to the input terminal; a first series connection of transistors being provided between a low voltage line having an original low voltage level and an output side of the inverter and having gates connected to the input terminal and a high voltage line having an original high voltage level and the transistors drive the gate of one of the driver transistors on the driver section; and a second series connection of transistors being provided between a high voltage line having an original high voltage level and the output side of the inverter and having gates connected to the input terminal and a low voltage line having an original low voltage level and the transistors drive the gate of another of the driver transistors on the driver section.

It is also preferable that the input section comprises: a first CMOS inverter between a low voltage line having an original low voltage level and a transistor connected to a high voltage line having an original high voltage and the first CMOS inverter having gates connected to the input terminal and the first CMOS inverter drives the gate of one of the driver transistors on the driver section; and a second CMOS inverter between a high voltage line having an original high voltage level and a transistor connected to a low voltage line having an original low voltage and the second CMOS inverter having gates connected to the input terminal and the second CMOS inverter drives the gates of one of the driver transistors on the driver section.

FIRST EMBODIMENT

Figure 5:
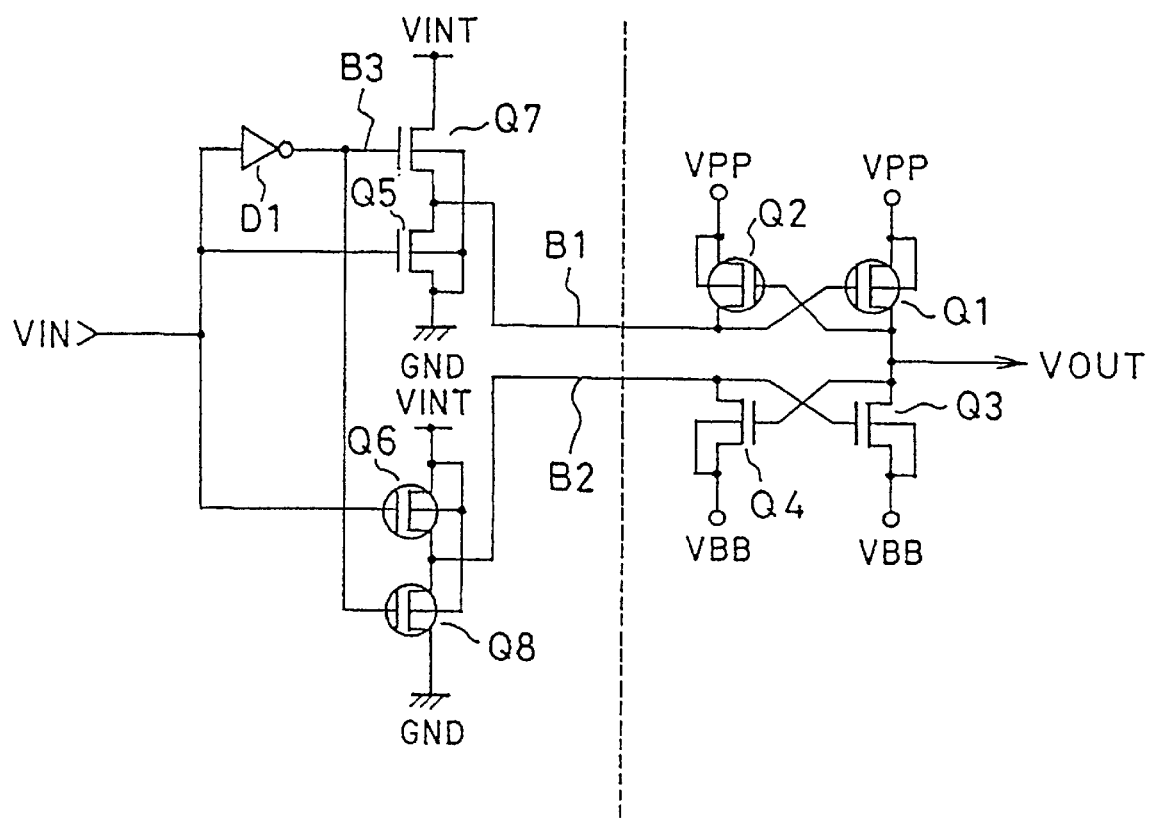
FIG. 5 is a circuit diagram illustrative of a novel level converter circuit capable of exhibiting a high speed logic voltage level conversion operations in a first embodiment in accordance with the present invention.
Figure 9:
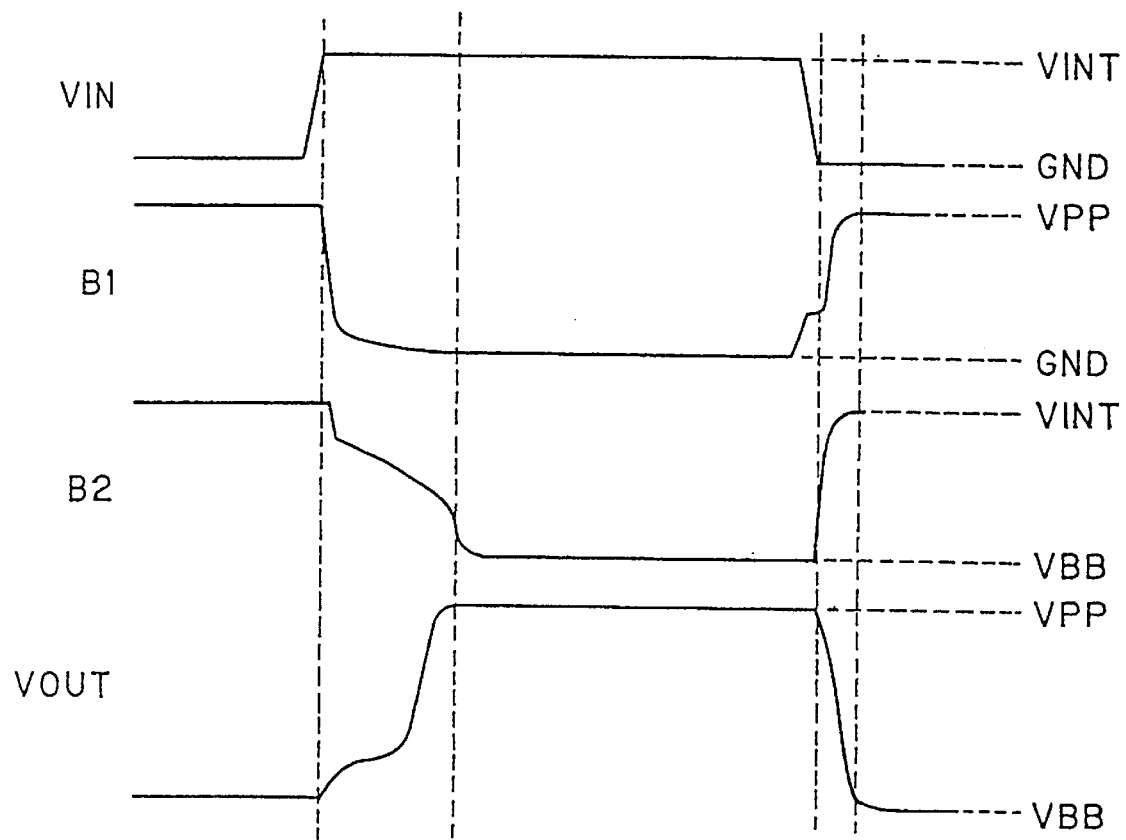
FIG. 9 is a timing chart illustrative of waveforms of the novel level converter circuit as illustrated in FIG. 5.

A first embodiment according to the present invention will be described in detail with reference to FIGS. 5 and 9. FIG. 5 is a circuit diagram illustrative of a novel level converter circuit capable of exhibiting a high speed logic voltage level conversion operations. FIG. 9 is a timing chart illustrative of waveforms of the novel level converter circuit as illustrated in FIG. 5. A circuit configuration of the novel level converter circuit will be described as follows.

The novel level converter circuit has an input section and a driver section. The input section has an input terminal into which an input voltage VIN is inputted whilst the driver section has an output terminal from which an output voltage VOUT is outputted. The input section and the driver section are connected through first and second nodes B1 and B2. The input section has input logic gates biased between an internal power voltage VINT and a ground level GND. The driver section has a driver circuit biased between a high power voltage VPP which is higher than the internal power voltage VINT and a low power voltage VBB which is lower than the ground level GND. The novel level converter circuit converts the internal logic levels, for example, HIGH level: internal power voltage VINT and LOW level: ground level GND into the high power voltage VPP and the low power voltage VBB.

The circuit configuration of the driver section of the novel level converter circuit is the same as that of the conventional level converter circuit as described above. Namely, the driver section of the novel level converter circuit comprises first and second p-channel MOS field effect transistors Q1 and Q2 and third and fourth n-channel MOS field effect transistors Q3 and Q4. The first p-channel MOS field effect transistor Q1 is connected in series between a high power voltage line VPP having the high power voltage VPP and the output terminal VOUT. A substrate of the first p-channel MOS field effect transistor Q1 is electrically connected to the high power voltage line VPP so that the substrate has the high power voltage VPP. A gate of the first p-channel MOS field effect transistor Q1 is connected to the first node B1. The third n-channel MOS field effect transistor Q3 is connected in series between a low power voltage line VBB having the low power voltage VBB and the output terminal VOUT. A substrate of the third n-channel MOS field effect transistor Q3 is electrically connected to the low power voltage line VBB so that the substrate has the low power voltage VBB. A gate of the third n-channel MOS field effect transistor Q3 is connected to the second node B2. The second p-channel MOS field effect transistor Q2 is connected in series between the high power voltage line VPP having the high power voltage VPP and the first node B1. A substrate of the second p-channel MOS field effect transistor Q2 is electrically connected to the high power voltage line VPP so that the substrate has the high power voltage VPP. A gate of the second p-channel MOS field effect transistor Q2 is connected to the output terminal VOUT. The fourth n-channel MOS field effect transistor Q4 is connected in series between the low power voltage line VBB having the low power voltage VBB and the second node B2. A substrate of the fourth n-channel MOS field effect transistor Q4 is electrically connected to the low power voltage line VBB so that the substrate has the low power voltage VBB. A gate of the fourth n-channel MOS field effect transistor Q4 is connected to the output terminal VOUT.

The input section of the novel level converter circuit comprises an inverter D1, fifth and seventh n-channel MOS field effect transistors Q5 and Q7 and sixth and eighth p-channel MOS field effect transistors Q6 and Q8. The inverter D1 has an input side which is connected to the input terminal VIN and an output side which is connected to a third node B3. The fifth n-channel MOS field effect transistor Q5 is connected in series between the first node B1 and a ground line GND having the ground voltage GND. A substrate of the fifth n-channel MOS field effect transistor Q5 is connected to the ground line GND so that the substrate has the ground voltage GND. A gate of the fifth n-channel MOS field effect transistor Q5 is connected to the input terminal VIN. The sixth p-channel MOS field effect transistor Q6 is connected in series between the second node B2 and an internal power voltage line VINT having the internal power voltage VINT. A substrate of the sixth p-channel MOS field effect transistor Q6 is connected to the internal power voltage line VINT so that the substrate has the internal power voltage VINT. A gate of the sixth p-channel MOS field effect transistor Q6 is connected to the input terminal VIN. The seventh n-channel MOS field effect transistor Q7 is connected in series between the first node B1 and the internal power voltage line VINT. A substrate of the seventh n-channel MOS field effect transistor Q7 is connected to the ground line GND so that the substrate has the ground voltage GND. A gate of the seventh n-channel MOS field effect transistor Q7 is connected to the third node B3. The eighth p-channel MOS field effect transistor Q8 is connected in series between the second node B2 and the ground line GND. A substrate of the eighth p-channel MOS field effect transistor Q8 is connected to the internal power voltage line VINT so that the substrate has the internal power voltage VINT. A gate of the eighth p-channel MOS field effect transistor Q8 is connected to the third node B3. The fifth and seventh n-channel MOS field effect transistors Q5 and Q7 are connected in series between the internal power voltage line VINT and the ground line GND. The sixth and eighth p-channel MOS field effect transistors Q6 and Q8 are also connected in series between the internal power voltage line VINT and the ground line GND.

For comparison to the conventional level converter circuit, the transistors Q1, Q2, Q3, Q4, Q5 and Q6 of the novel level converter circuit have the same size as the transistors Q1, Q2, Q3, Q4, Q5 and Q6 of the conventional level converter circuit respectively. The remaining transistors Q7 and Q8 have the same size as or smaller size than the transistors Q5 and Q6 respectively. The inverter D1 has such a size as capable of driving the transistors Q7 and Q8.

First, the rise-operation of the output voltage VOUT will be described as follows.

When the input voltage VIN is in the ground level GND, then the third node B3 in the output side of the invertor D1 has the voltage level VINT, whilst the first node B1 has the voltage level VPP and the second node B2 has the voltage level VINT and further the output terminal VOUT has the voltage level VBB. The transistors Q1, Q5, Q7, Q4 and Q8 are in the non-conductive states or OFF state, whilst the remaining transistors Q6, Q2 and Q3 are in the conductive state or ON state whereby the individual nodes are connected to the power voltages.

When the input voltage VIN rises from the ground level GND to the voltage level VINT, the potential of the third node B3 is dropped from the voltage level VINT to the ground level GND.

When the input voltage VIN becomes not lower than the voltage level VTN corresponding to the threshold voltage of the n-channel MOS field effect transistors, the fifth transistor Q5 having the gate receiving the input voltage VIN turns ON or comes into the conductive state and further if the potential of the third node B3 as the output side of the inverter D1 is dropped, then the seventh transistor Q7 having the gate connected to the third node B3 turns OFF or comes into the non-conductive state, whereby the potential of the first node B1 is dropped to the ground level GND.

When the input voltage VIN becomes not lower than the voltage level VINT−|VTP| where VTP corresponds to the threshold voltage of the p-channel MOS field effect transistors, the sixth transistor Q6 having the gate receiving the input voltage VIN turns OFF or comes into the non-conductive state, and further if the potential of the third node B3 as the output side of the inverter D1 is dropped to the ground level GND, then the eighth transistor Q8 having the gate connected to the third node B3 turns ON or comes into the conductive state, whereby the potential of the second node B2 is dropped to approach the voltage level |VTP|. Since at this time the source and drain voltage of the eighth transistor Q8 or the voltage applied across the second node B2 and the ground line GND is reduced, then the driving ability of the eighth transistor Q8 is dropped whereby the potential or the voltage level of the second node B2 is gradually dropped.

When the potential or the voltage level of the first node B1 comes not higher than a voltage level VPP−|VTP|, then the first transistor Q1 turns ON or comes into the conductive state where the third transistor Q3 has remained in the conductive state or ON state, for which reason the output voltage VOUT gradually rises.

When the output voltage VOUT comes not lower than a voltage level VBB+VTN, then the fourth transistor Q4 turns ON or comes into the conductive state, whereby the potential or the voltage level of the second node B2 is dropped to the voltage level VBB. As a result, the third and eighth transistors Q3 and Q8 comes into the non-conductive state or turn OFF. At this time, the output voltage VOUT rises to the voltage level VPP and the second transistor Q2 remains OFF or the non-conductive state whilst the first and fifth transistors Q1 and Q5 remain ON or the conductive state.

Subsequently, the fall-operation of the output voltage VOUT will be described as follows.

When the input voltage VIN is in the voltage level VINT, then the third node B3 in the output side of the invertor D1 has the ground level GND, whilst the first node B1 has the ground level GND and the second node B2 has the voltage level VBB and further the output terminal VOUT has the voltage level VPP. The transistors Q2, Q3, Q6, Q7 and Q8 are in the non-conductive states or OFF state, whilst the remaining transistors Q1, Q4 and Q5 are in the conductive state or ON state whereby the individual nodes are connected to the power voltages.

When the input voltage VIN is dropped from the voltage level VINT to the ground level GND, the potential of the third node B3 is risen from the ground level GND to the voltage level VINT.

When the input voltage VIN becomes not higher than the voltage level VINT−|VTP|, the sixth transistor Q6 having the gate receiving the input voltage VIN turns ON or comes into the conductive state and further if the potential of the third node B3 as the output side of the inverter D1 is risen up to the voltage level VINT, then the eighth transistor Q8 having the gate connected to the third node B3 turns OFF or comes into the non-conductive state, whereby the potential of the second node B2 is risen to the voltage level VINT.

When the input voltage VIN becomes not higher than the voltage level VTN, the fifth transistor Q5 having the gate receiving the input voltage VIN turns OFF or comes into the non-conductive state, and further if the potential of the third node B3 as the output side of the inverter D1 is risen up to the voltage level VINT, then the seventh transistor Q7 having the gate connected to the third node B3 turns ON or comes into the conductive state, whereby the potential of the first node B1 is risen to approach the voltage level VINT−VTN. Since at this time the source and drain voltage of the seventh transistor Q7 or the voltage applied across the first node B1 and the internal power voltage line VINT is reduced, then the driving ability of the seventh transistor Q7 is dropped whereby the potential or the voltage level of the first node B1 is gradually risen.

When the potential or the voltage level of the second node B2 comes not lower than a voltage level VBB+VTN, then the third transistor Q3 turns ON or comes into the conductive state.

When the output voltage VOUT comes not higher than a voltage level VPP−|VTP|, then the second transistor Q2 turns ON or comes into the conductive state, whereby the potential or the voltage level of the first node B1 is risen to the voltage level VPP. As a result, the first and seventh transistors Q1 and Q7 comes into the non-conductive state or turn OFF. At this time, the output voltage VOUT is dropped to the voltage level VBB and the fourth transistor Q4 remains OFF state or the non-conductive state whilst the third and sixth transistors Q3 and Q6 remain ON state or the conductive state.

In the above novel level converter circuit illustrated in FIG. 5, the gate of the first transistor Q1 on the driver section is driven by the single transistor Q5 on the input section whose gate receives the input voltage VIN whilst the gate of the third transistor Q3 on the driver section is driven by the single transistor Q6 on the input section whose gate receives the input voltage VIN, for which reason driving ability of the transistor on the input section for driving the gate of the transistor on the driver section is improved for allowing the level converter circuit to exhibit high speed output voltage level conversion operations.

SECOND EMBODIMENT

A second embodiment according to the present invention will be described in detail with reference to FIG. 6 which is a circuit diagram illustrative of a novel level converter circuit capable of exhibiting a high speed logic voltage level conversion operations. A difference in circuit configuration of the novel level converter circuit of the second embodiment from that in the first embodiment is in that the seventh transistor Q7 is connected to the higher power voltage VPP and the eighth transistor Q8 is connected to the lower power voltage VBB. The timing waveforms of the novel level converter circuit of the second embodiment are the same as in the first embodiment and are as illustrated in FIG. 5. The novel level converter circuit converts the internal logic levels, for example, HIGH level: internal power voltage VINT and LOW level: ground level GND into the high power voltage VPP and the low power voltage VBB.

The novel level converter circuit has an input section and a driver section. The input section has an input terminal into which an input voltage VIN is inputted whilst the driver section has an output terminal from which an output voltage VOUT is outputted. The input section and the driver section are connected through first and second nodes B1 and B2.

The circuit configuration of the driver section of the novel level converter circuit is the same as that of the conventional level converter circuit as described above. Namely, the driver section of the novel level converter circuit comprises first and second p-channel MOS field effect transistors Q1 and Q2 and third and fourth n-channel MOS field effect transistors Q3 and Q4. The first p-channel MOS field effect transistor Q1 is connected in series between a high power voltage line VPP having the high power voltage VPP and the output terminal VOUT. A substrate of the first p-channel MOS field effect transistor Q1 is electrically connected to the high power voltage line VPP so that the substrate has the high power voltage VPP. A gate of the first p-channel MOS field effect transistor Q1 is connected to the first node B1. The third n-channel MOS field effect transistor Q3 is connected in series between a low power voltage line VBB having the low power voltage VBB and the output terminal VOUT. A substrate of the third n-channel MOS field effect transistor Q3 is electrically connected to the low power voltage line VBB so that the substrate has the low power voltage VBB. A gate of the third n-channel MOS field effect transistor Q3 is connected to the second node B2. The second p-channel MOS field effect transistor Q2 is connected in series between the high power voltage line VPP having the high power voltage VPP and the first node B1. A substrate of the second p-channel MOS field effect transistor Q2 is electrically connected to the high power voltage line VPP so that the substrate has the high power voltage VPP. A gate of the second p-channel MOS field effect transistor Q2 is connected to the output terminal VOUT. The fourth n-channel MOS field effect transistor Q4 is connected in series between the low power voltage line VBB having the low power voltage VBB and the second node B2. A substrate of the fourth n-channel MOS field effect transistor Q4 is electrically connected to the low power voltage line VBB so that the substrate has the low power voltage VBB. A gate of the fourth n-channel MOS field effect transistor Q4 is connected to the output terminal VOUT.

The input section of the novel level converter circuit comprises an inverter D1, fifth and seventh n-channel MOS field effect transistors Q5 and Q7 and sixth and eighth p-channel MOS field effect transistors Q6 and Q8. The inverter D1 has an input side which is connected to the input terminal VIN and an output side which is connected to a third node B3. The fifth n-channel MOS field effect transistor Q5 is connected in series between the first node B1 and a ground line GND having the ground voltage GND. A substrate of the fifth n-channel MOS field effect transistor Q5 is connected to the ground line GND so that the substrate has the ground voltage GND. A gate of the fifth n-channel MOS field effect transistor Q5 is connected to the input terminal VIN. The sixth p-channel MOS field effect transistor Q6 is connected in series between the second node B2 and an internal power voltage line VINT having the internal power voltage VINT. A substrate of the sixth p-channel MOS field effect transistor Q6 is connected to the internal power voltage line VINT so that the substrate has the internal power voltage VINT. A gate of the sixth p-channel MOS field effect transistor Q6 is connected to the input terminal VIN. The seventh n-channel MOS field effect transistor Q7 is connected in series between the first node B1 and the high power voltage line VPP. A substrate of the seventh n-channel MOS field effect transistor Q7 is connected to the ground line GND so that the substrate has the ground voltage GND. A gate of the seventh n-channel MOS field effect transistor Q7 is connected to the third node B3. The eighth p-channel MOS field effect transistor Q8 is connected in series between the second node B2 and the low power voltage line VBB. A substrate of the eighth p-channel MOS field effect transistor Q8 is connected to the internal power voltage line VINT so that the substrate has the internal power voltage VINT. A gate of the eighth p-channel MOS field effect transistor Q8 is connected to the third node B3. The fifth and seventh n-channel MOS field effect transistor Q5 and Q7 are connected in series between the high power voltage line VPP and the ground line GND. The sixth and eighth p-channel MOS field effect transistors Q6 and Q8 are also connected in series between the internal power voltage line VINT and the low power voltage line VBB.

For comparison to the conventional level converter circuit, the transistors Q1, Q2, Q3, Q4, Q5 and Q6 of the novel level converter circuit have the same size as the transistors Q1, Q2, Q3, Q4, Q5 and Q6 of the conventional level converter circuit respectively. The remaining transistors Q7 and Q8 have the same size as or smaller size than the transistors Q5 and Q6 respectively. The inverter D1 has such a size as capable of driving the transistors Q7 and Q8.

First, the rise-operation of the output voltage VOUT will be described as follows.

When the input voltage VIN is in the ground level GND, then the third node B3 in the output side of the invertor D1 has the voltage level VINT, whilst the first node B1 has the voltage level VPP and the second node B2 has the voltage level VINT and further the output terminal VOUT has the voltage level VBB. The transistors Q1, Q5, Q7, Q4 and Q8 are in the non-conductive states or OFF state, whilst the remaining transistors Q6, Q2 and Q3 are in the conductive state or ON state whereby the individual nodes are connected to the power voltages.

When the input voltage VIN is risen from the ground level GND to the voltage level VINT, the potential of the third node B3 is dropped from the voltage level VINT to the ground level GND.

When the input voltage VIN becomes not lower than the voltage level VTN corresponding to the threshold voltage of the n-channel MOS field effect transistors, the fifth transistor Q5 having the gate receiving the input voltage VIN turns ON or comes into the conductive state and further if the potential of the third node B3 as the output side of the inverter D1 is dropped, then the seventh transistor Q7 having the gate connected to the third node B3 turns OFF or comes into the non-conductive state, whereby the potential of the first node B1 is dropped to the ground level GND.

When the input voltage VIN becomes not lower than the voltage level VINT−|VTP| where VTP corresponds to the threshold voltage of the p-channel MOS field effect transistors, the sixth transistor Q6 having the gate receiving the input voltage VIN turns OFF or comes into the non-conductive state, and further if the potential of the third node B3 as the output side of the inverter D1 is dropped to the ground level GND, then the eighth transistor Q8 having the gate connected to the third node B3 turns ON or comes into the conductive state, whereby the potential of the second node B2 is dropped to approach the voltage level |VTP|. Since the second node B2 or the gate of the third transistor Q3 is conductive to the low power voltage line VBB having the low power voltage level VBB which is lower than the ground level GND, then the driving ability of the eighth transistor Q8 for drawing the potential of the second node B2 or the potential of the gate of the third transistor Q3 is higher than in the first embodiment. The transition time of the third transistor Q3 into the non-conductive state or the OFF state is shortened whereby the rise time of the output voltage VOUT is shorten.

When the potential or the voltage level of the first node B1 comes not higher than a voltage level VPP−|VTP|, then the first transistor Q1 turns ON or comes into the conductive state where the third transistor Q3 has remained in the conductive state or ON state, for which reason the output voltage VOUT is risen.

When the output voltage VOUT comes not lower than a voltage level VBB+VTN, then the fourth transistor Q4 turns ON or comes into the conductive state, whereby the potential or the voltage level of the second node B2 is dropped to the voltage level VBB. As a result, the third and eighth transistors Q3 and Q8 comes into the non-conductive state or turn OFF. At this time, the output voltage VOUT is risen to the voltage level VPP and the second transistor Q2 remains OFF state or the non-conductive state whilst the first and fifth transistors Q1 and Q5 remain ON state or the conductive state.

Subsequently, the fall-operation of the output voltage VOUT will be described as follows.

When the input voltage VIN is in the voltage level VINT, then the third node B3 in the output side of the invertor D1 has the ground level GND, whilst the first node B1 has the ground level GND and the second node B2 has the voltage level VBB and further the output terminal VOUT has the voltage level VPP. The transistors Q2, Q3, Q6, Q7 and Q8 are in the non-conductive states or OFF state, whilst the remaining transistors Q1, Q4 and Q5 are in the conductive state or ON state whereby the individual nodes are connected to the power voltages.

When the input voltage VIN is dropped from the voltage level VINT to the ground level GND, the potential of the third node B3 is risen from the ground level GND to the voltage level VINT.

When the input voltage VIN becomes not higher than the voltage level VINT−|VTP|, the sixth transistor Q6 having the gate receiving the input voltage VIN turns ON or comes into the conductive state and further if the potential of the third node B3 as the output side of the inverter D1 is risen up to the voltage level VINT, then the eighth transistor Q8 having the gate connected to the third node B3 turns OFF or comes into the non-conductive state, whereby the potential of the second node B2 is risen to the voltage level VINT.

When the input voltage VIN becomes not higher than the voltage level VTN, the fifth transistor Q5 having the gate receiving the input voltage VIN turns OFF or comes into the non-conductive state, and further if the potential of the third node B3 as the output side of the inverter D1 is risen up to the voltage level VINT, then the seventh transistor Q7 having the gate connected to the third node B3 turns ON or comes into the conductive state, whereby the potential of the first node B1 is risen to approach the voltage level VINT−VTN. Since the first node B1 or the gate of the first transistor Q1 is conductive to the high power voltage line VPP having the high power voltage level VPP which is higher than the internal power voltage level VINT, then the driving ability of the seventh transistor Q7 for rising the potential of the first node B1 or the potential of the gate of the first transistor Q1 is higher than in the first embodiment. The transition time of the first transistor Q1 into the conductive state or the ON state is shortened whereby the fall time of the output voltage VOUT is shorten.

When the potential or the voltage level of the second node B2 comes not lower than a voltage level VBB+VTN, then the third transistor Q3 turns ON or comes into the conductive state.

When the output voltage VOUT comes not higher than a voltage level VPP−|VTP|, then the second transistor Q2 turns ON or comes into the conductive state, whereby the potential or the voltage level of the first node B1 is risen to the voltage level VPP. As a result, the first and seventh transistors Q1 and Q7 comes into the non-conductive state or turn OFF. At this time, the output voltage VOUT is dropped to the voltage level VBB and the fourth transistor Q4 remains OFF state or the non-conductive state whilst the third and sixth transistors Q3 and Q6 remain ON state or the conductive state.

Figure 6:
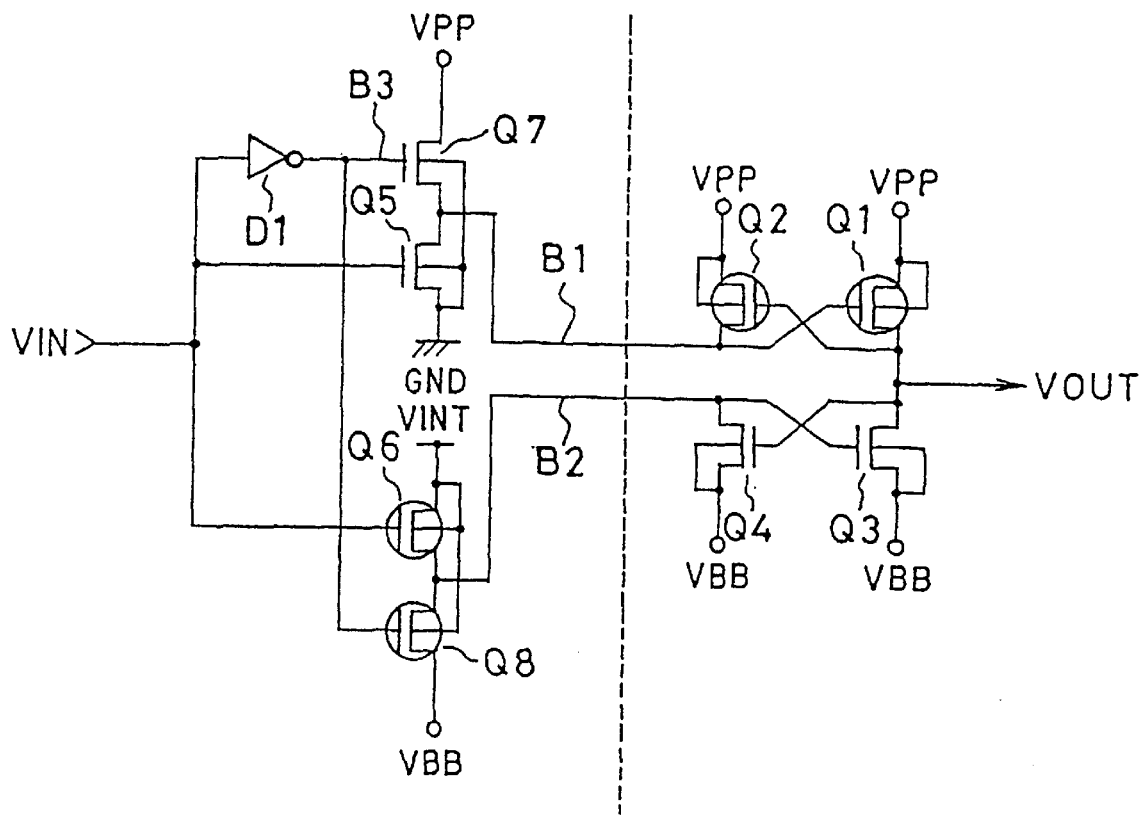
FIG. 6 which is a circuit diagram illustrative of a novel level converter circuit capable of exhibiting a high speed logic voltage level conversion operations in a second embodiment in accordance with the present invention.

In the above novel level converter circuit illustrated in FIG. 6, the gate of the first transistor Q1 on the driver section is driven by the single transistor Q5 on the input section and having the gate receiving the input voltage VIN whilst the gate of the third transistor Q3 on the driver section is driven by the single transistor Q6 on the input section and having the gate receiving the input voltage VIN, for which reason driving ability of the transistor on the input section for driving the gate of the transistor on the driver section is improved for allowing the level converter circuit to exhibit high speed output voltage level conversion operations.

THIRD EMBODIMENT

A third embodiment according to the present invention will be described in detail with reference to FIG. 7 which is a circuit diagram illustrative of a novel level converter circuit capable of exhibiting a high speed logic voltage level conversion operations.

The novel level converter circuit has an input section and a driver section. The input section has an input terminal into which an input voltage VIN is inputted whilst the driver section has an output terminal from which an output voltage VOUT is outputted. The input section and the driver section are connected through first and second nodes B1 and B2. The input section has input logic gates biased between an internal power voltage VINT and a ground level GND. The driver section has a driver circuit biased between a high power voltage VPP which is higher than the internal power voltage VINT and a low power voltage VBB which is lower than the ground level GND. The novel level converter circuit converts the internal logic levels, for example, HIGH level: internal power voltage VINT and LOW level: ground level GND into the high power voltage VPP and the low power voltage VBB.

The circuit configuration of the driver section of the novel level converter circuit is the same as that of the conventional level converter circuit as described above. Namely, the driver section of the novel level converter circuit comprises first and second p-channel MOS field effect transistors Q1 and Q2 and third and fourth n-channel MOS field effect transistors Q3 and Q4. The first p-channel MOS field effect transistor Q1 is connected in series between a high power voltage line VPP having the high power voltage VPP and the output terminal VOUT. A substrate of the first p-channel MOS field effect transistor Q1 is electrically connected to the high power voltage line VPP so that the substrate has the high power voltage VPP. A gate of the first p-channel MOS field effect transistor Q1 is connected to the first node B1. The third n-channel MOS field effect transistor Q3 is connected in series between a low power voltage line VBB having the low power voltage VBB and the output terminal VOUT. A substrate of the third n-channel MOS field effect transistor Q3 is electrically connected to the low power voltage line VBB so that the substrate has the low power voltage VBB. A gate of the third n-channel MOS field effect transistor Q3 is connected to the second node B2. The second p-channel MOS field effect transistor Q2 is connected in series between the high power voltage line VPP having the high power voltage VPP and the first node B1. A substrate of the second p-channel MOS field effect transistor Q2 is electrically connected to the high power voltage line VPP so that the substrate has the high power voltage VPP. A gate of the second p-channel MOS field effect transistor Q2 is connected to the output terminal VOUT. The fourth n-channel MOS field effect transistor Q4 is connected in series between the low power voltage line VBB having the low power voltage VBB and the second node B2. A substrate of the fourth n-channel MOS field effect transistor Q4 is electrically connected to the low power voltage line VBB so that the substrate has the low power voltage VBB. A gate of the fourth n-channel MOS field effect transistor Q4 is connected to the output terminal VOUT.

The input section of the novel level converter circuit comprises an inverter D1, fifth and seventh n-channel MOS field effect transistors Q5 and Q7 and sixth and eighth p-channel MOS field effect transistors Q6 and Q8. The inverter D1 has an input side which is connected to the input terminal VIN and an output side which is connected to a third node B3. The fifth n-channel MOS field effect transistor Q5 is connected in series between the first node B1 and a ground line GND having the ground voltage GND. A substrate of the fifth n-channel MOS field effect transistor Q5 is connected to the ground line GND so that the substrate has the ground voltage GND. A gate of the fifth n-channel MOS field effect transistor Q5 is connected to the input terminal VIN. The sixth p-channel MOS field effect transistor Q6 is connected in series between the second node B2 and an internal power voltage line VINT having the internal power voltage VINT. A substrate of the sixth p-channel MOS field effect transistor Q6 is connected to the internal power voltage line VINT so that the substrate has the internal power voltage VINT. A gate of the sixth p-channel MOS field effect transistor Q6 is connected to the input terminal VIN. The seventh n-channel MOS field effect transistor Q7 is connected in series between the first node B1 and the third node B3. A substrate of the seventh n-channel MOS field effect transistor Q7 is connected to the ground line GND so that the substrate has the ground voltage GND. A gate of the seventh n-channel MOS field effect transistor Q7 is connected to the internal power voltage line VINT. The eighth p-channel MOS field effect transistor Q8 is connected in series between the second node B2 and the third node B3. A substrate of the eighth p-channel MOS field effect transistor Q8 is connected to the internal power voltage line VINT so that the substrate has the internal power voltage VINT. A gate of the eighth p-channel MOS field effect transistor Q8 is connected to the ground line GND. The fifth and seventh n-channel MOS field effect transistors Q5 and Q7 are connected in series between the third node B3 and the ground line GND. The sixth and eighth p-channel MOS field effect transistors Q6 and Q8 are also connected in series between the internal power voltage line VINT and the third node B3.

For comparison to the conventional level converter circuit, the transistors Q1, Q2, Q3, Q4, Q5 and Q6 of the novel level converter circuit have the same size as the transistors Q1, Q2, Q3, Q4, Q5 and Q6 of the conventional level converter circuit respectively. The remaining transistors Q7 and Q8 have the same size as or smaller size than the transistors Q5 and Q6 respectively. The inverter D1 has such a size as capable of driving the transistors Q7 and Q8.

Figure 7:
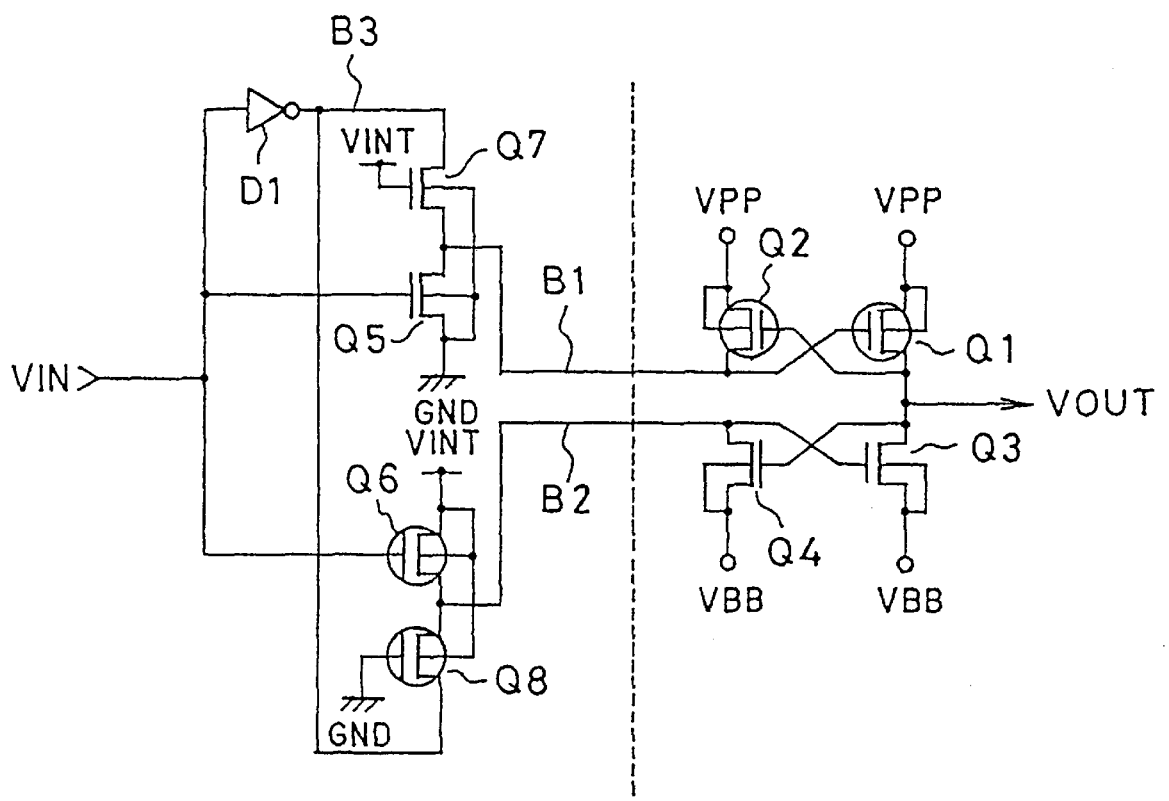
FIG. 7 which is a circuit diagram illustrative of a novel level converter circuit capable of exhibiting a high speed logic voltage level conversion operations in a third embodiment in accordance with the present invention.

The timing waveforms of the above novel level converter circuit illustrated in FIG. 7 are basically unchanged from those illustrated in FIG. 5.

First, the rise-operation of the output voltage VOUT will be described as follows.

When the input voltage VIN is in the ground level GND, then the third node B3 in the output side of the invertor D1 has the voltage level VINT, whilst the first node B1 has the voltage level VPP and the second node B2 has the voltage level VINT and further the output terminal VOUT has the voltage level VBB. The transistors Q1, Q5, Q7 and Q4 are in the non-conductive states or OFF state, whilst the remaining transistors Q6, Q2, Q3 and Q8 are in the conductive state or ON state whereby the individual nodes are connected to the power voltages.

When the input voltage VIN is risen from the ground level GND to the voltage level VINT, the potential of the third node B3 is dropped from the voltage level VINT to the ground level GND.

When the input voltage VIN becomes not lower than the voltage level VTN corresponding to the threshold voltage of the n-channel MOS field effect transistors, the fifth transistor Q5 having the gate receiving the input voltage VIN turns ON or comes into the conductive state and further if the potential of the third node B3 as the output side of the inverter D1 is dropped to the ground level GND, then the seventh transistor Q7 connected to the third node B3 remains ON or the conductive state, whereby the potential of the first node B1 is dropped to the ground level GND.

When the input voltage VIN becomes not lower than the voltage level VINT−|VTP| where VTP corresponds to the threshold voltage of the p-channel MOS field effect transistors, the sixth transistor Q6 having the gate receiving the input voltage VIN turns OFF or comes into the non-conductive state, and further if the potential of the third node B3 as the output side of the inverter D1 is dropped to the ground level GND, then the eighth transistor Q8 connected to the third node B3 turns ON or comes into the conductive state, whereby the potential of the second node B2 is dropped to approach the voltage level |VTP|. Since at this time the source and drain voltage of the eighth transistor Q8 or the voltage applied across the second node B2 and the ground line GND is reduced, then the driving ability of the eighth transistor Q8 is dropped whereby the potential or the voltage level of the second node B2 is gradually dropped.

When the potential or the voltage level of the first node B1 comes not higher than a voltage level VPP−|VTP|, then the first transistor Q1 turns ON or comes into the conductive state where the third transistor Q3 has remained in the conductive state or ON state, for which reason the output voltage VOUT is gradually risen.

When the output voltage VOUT comes not lower than a voltage level VBB+VTN, then the fourth transistor Q4 turns ON or comes into the conductive state, whereby the potential or the voltage level of the second node B2 is dropped to the voltage level VBB. As a result, the third and eighth transistors Q3 and Q8 comes into the non-conductive state or turn OFF. At this time, the output voltage VOUT is risen to the voltage level VPP and the second transistor Q2 remains OFF state or the non-conductive state whilst the first and fifth transistors Q1 and Q5 remain ON state or the conductive state.

Subsequently, the fall-operation of the output voltage VOUT will be described as follows.

When the input voltage VIN is in the voltage level VINT, then the third node B3 in the output side of the invertor D1 has the ground level GND, whilst the first node B1 has the ground level GND and the second node B2 has the voltage level VBB and further the output terminal VOUT has the voltage level VPP. The transistors Q2, Q3, Q6 and Q8 are in the non-conductive states or OFF state, whilst the remaining transistors Q1, Q4, Q5 and Q7 are in the conductive state or ON state whereby the individual nodes are connected to the power voltages.

When the input voltage VIN is dropped from the voltage level VINT to the ground level GND, the potential of the third node B3 is risen from the ground level GND to the voltage level VINT.

When the input voltage VIN becomes not higher than the voltage level VINT−|VTP|, the sixth transistor Q6 having the gate receiving the input voltage VIN turns ON or comes into the conductive state and further if the potential of the third node B3 as the output side of the inverter D1 is risen up to the voltage level VINT, then the eighth transistor Q8 connected to the third node B3 turns ON or comes into the conductive state, whereby the potential of the second node B2 is risen to the voltage level VINT.

When the input voltage VIN becomes not higher than the voltage level VTN, the fifth transistor Q5 having the gate receiving the input voltage VIN turns OFF or comes into the non-conductive state, and further if the potential of the third node B3 as the output side of the inverter D1 is risen up to the voltage level VINT, then the seventh transistor Q7 connected to the third node B3 turns ON or comes into the conductive state, whereby the potential of the first node B1 is dropped to approach the voltage level VINT−VTN. Since at this time the source and drain voltage of the seventh transistor Q7 or the voltage applied across the first node B1 and the third node B3 is reduced, then the driving ability of the seventh transistor Q7 is dropped whereby the potential or the voltage level of the first node B1 is gradually risen.

When the potential or the voltage level of the second node B2 comes not lower than a voltage level VBB+VTN, then the third transistor Q3 turns ON or comes into the conductive state.

When the output voltage VOUT comes not higher than a voltage level VPP−|VTP|, then the second transistor Q2 turns ON or comes into the conductive state, whereby the potential or the voltage level of the first node B1 is risen to the voltage level VPP. As a result, the first and seventh transistors Q1 and Q7 comes into the non-conductive state or turn OFF. At this time, the output voltage VOUT is dropped to the voltage level VBB and the fourth transistor Q4 remains OFF state or the non-conductive state whilst the third and sixth transistors Q3 and Q6 remain ON state or the conductive state.

In the voltage rise operation of the above novel level converter circuit illustrated in FIG. 7, the potential or the voltage level of the first node B1 is risen by parallel operations of the fifth and seventh transistors Q5 and Q7. As a result, the transition time of the first node B1 into the ground level GND is shortened and further the current driving ability of the first transistor Q1 is improved, for which reason the rise time of the output voltage VOUT is shortened as compared to that in the first embodiment.

In the voltage fall operation of the above novel level converter circuit illustrated in FIG. 7, the potential or the voltage level of the second node B2 is risen by parallel operations of the sixth and eighth transistors Q6 and Q8. As a result, the transition time of the second node B2 into the internal power voltage level VINT is shortened and further the current driving ability of the third transistor Q3 is improved, for which reason the fall time of the output voltage VOUT is shortened as compared to that in the first embodiment.

FOURTH EMBODIMENT

A fourth embodiment according to the present invention will be described in detail with reference to FIG. 8 which is a circuit diagram illustrative of a novel level converter circuit capable of exhibiting a high speed logic voltage level conversion operations. A circuit configuration of the novel level converter circuit will be described as follows.

The novel level converter circuit has an input section and a driver section. The input section has an input terminal into which an input voltage VIN is inputted whilst the driver section has an output terminal from which an output voltage VOUT is outputted. The input section and the driver section are connected through first and second nodes B1 and B2. The input section has input logic gates biased between an internal power voltage VINT and a ground level GND. The driver section has a driver circuit biased between a high power voltage VPP which is higher than the internal power voltage VINT and a low power voltage VBB which is lower than the ground level GND. The novel level converter circuit converts the internal logic levels, for example, HIGH level: internal power voltage VINT and LOW level: ground level GND into the high power voltage VPP and the low power voltage VBB.

The circuit configuration of the driver section of the novel level converter circuit is the same as that of the conventional level converter circuit as described above. Namely, the driver section of the novel level converter circuit comprises first and second p-channel MOS field effect transistors Q1 and Q2 and third and fourth n-channel MOS field effect transistors Q3 and Q4. The first p-channel MOS field effect transistor Q1 is connected in series between a high power voltage line VPP having the high power voltage VPP and the output terminal VOUT. A substrate of the first p-channel MOS field effect transistor Q1 is electrically connected to the high power voltage line VPP so that the substrate has the high power voltage VPP. A gate of the first p-channel MOS field effect transistor Q1 is connected to the first node B1. The third n-channel MOS field effect transistor Q3 is connected in series between a low power voltage line VBB having the low power voltage VBB and the output terminal VOUT. A substrate of the third n-channel MOS field effect transistor Q3 is electrically connected to the low power voltage line VBB so that the substrate has the low power voltage VBB. A gate of the third n-channel MOS field effect transistor Q3 is connected to the second node B2. The second p-channel MOS field effect transistor Q2 is connected in series between the high power voltage line VPP having the high power voltage VPP and the first node B1. A substrate of the second p-channel MOS field effect transistor Q2 is electrically connected to the high power voltage line VPP so that the substrate has the high power voltage VPP. A gate of the second p-channel MOS field effect transistor Q2 is connected to the output terminal VOUT. The fourth n-channel MOS field effect transistor Q4 is connected in series between the low power voltage line VBB having the low power voltage VBB and the second node B2. A substrate of the fourth n-channel MOS field effect transistor Q4 is electrically connected to the low power voltage line VBB so that the substrate has the low power voltage VBB. A gate of the fourth n-channel MOS field effect transistor Q4 is connected to the output terminal VOUT.

The input section of the novel level converter circuit comprises fifth, eleventh and twelfth n-channel MOS field effect transistors Q5, Q11 and Q12 and sixth, ninth and tenth p-channel MOS field effect transistors Q6, Q9 and Q10. The fifth n-channel MOS field effect transistor Q5 is connected in series between the first node B1 and a ground line GND having the ground voltage GND. A substrate of the fifth n-channel MOS field effect transistor Q5 is connected to the ground line GND so that the substrate has the ground voltage GND. A gate of the fifth n-channel MOS field effect transistor Q5 is connected to the input terminal VIN. The sixth p-channel MOS field effect transistor Q6 is connected in series between the second node B2 and an internal power voltage line VINT having the internal power voltage VINT. A substrate of the sixth p-channel MOS field effect transistor Q6 is connected to the internal power voltage line VINT so that the substrate has the internal power voltage VINT. A gate of the sixth p-channel MOS field effect transistor Q6 is connected to the input terminal VIN. The ninth and tenth p-channel MOS field effect transistors Q9 and Q10 are connected in series between the first node B1 and the internal power voltage line VINT so that the ninth p-channel MOS field effect transistor Q9 is connected to the internal power voltage VINT whilst the tenth p-channel MOS field effect transistor Q10 is connected to the first node B1. A substrate of the ninth p-channel MOS field effect transistor Q9 is connected to the internal power voltage line VINT so that the substrate has the internal power voltage VINT. A substrate of the tenth p-channel MOS field effect transistor Q10 is also connected to the internal power voltage line VINT so that the substrate has the internal power voltage VINT. A gate of the ninth p-channel MOS field effect transistor Q9 is connected to the tenth p-channel MOS field effect transistor Q10. A gate of the tenth p-channel MOS field effect transistor Q10 is connected to the input terminal VIN. The eleventh and twelfth n-channel MOS field effect transistors Q11 and Q12 are connected in series between the second node B2 and the ground line GND so that the eleventh n-channel MOS field effect transistor Q11 is connected to the ground line GND whilst the twelfth n-channel MOS field effect transistor Q12 is connected to the second node B2. A substrate of the eleventh n-channel MOS field effect transistor Q11 is connected to the ground line GND so that the substrate has the ground voltage GND. A substrate of the twelfth n-channel MOS field effect transistor Q12 is also connected to the ground line GND so that the substrate has the ground voltage GND. A gate of the eleventh n-channel MOS field effect transistor Q11 is connected to the twelfth n-channel MOS field effect transistor Q12. A gate of the twelfth n-channel MOS field effect transistor Q12 is connected to the input terminal VIN.

The ninth and tenth transistors Q9 and Q10 have the same size as the sixth transistor Q6. The eleventh and twelfth transistors Q11 and Q12 have the same size as the fifth transistor Q5.

First, the rise-operation of the output voltage VOUT will be described as follows.

When the input voltage VIN is in the ground level GND, then the first node B1 has the voltage level VPP and the second node B2 has the voltage level VINT and further the output terminal VOUT has the voltage level VBB. The transistors Q1, Q5, Q4 and Q12 are in the non-conductive states or OFF state, whilst the remaining transistors Q6, Q2, Q3 and Q10 are in the conductive state or ON state whereby the individual nodes are connected to the power voltages.

When the input voltage VIN becomes not lower than the voltage level VTN corresponding to the threshold voltage of the n-channel MOS field effect transistors, the fifth transistor Q5 having the gate receiving the input voltage VIN turns ON or comes into the conductive state whereby the potential or the voltage level of the first node B1 is dropped to the ground level GND. When the input voltage VIN becomes the internal power voltage, then the potential of the first node B1 becomes not higher than a voltage level VINT+|VTP| where VTP corresponds to the threshold voltage of the p-channel MOS field effect transistors, whereby the tenth transistor Q10 having the gate receiving the input voltage VIN turns OFF or comes into the non-conductive state.

When the input voltage VIN becomes not lower than the voltage level VINT−|VTP| where VTP corresponds to the threshold voltage of the p-channel MOS field effect transistors, the sixth transistor Q6 having the gate receiving the input voltage VIN turns OFF or comes into the non-conductive state. If the input voltage VIN becomes the voltage level VINT, then the twelfth transistor Q12 having the gate connected to the input terminal VIN turns ON or comes into the conductive state, whereby the potential of the second node B2 is dropped to approach the voltage level |VTN|. Since at this time the source and drain voltage of the twelfth transistor Q12 is reduced, then the driving ability of the twelfth transistor Q12 is dropped whereby the potential or the voltage level of the second node B2 is gradually dropped.

When the potential or the voltage level of the first node B1 comes not higher than a voltage level VPP−|VTP|, then the first transistor Q1 turns ON or comes into the conductive state where the third transistor Q3 has remained in the conductive state or ON state, for which reason the output voltage VOUT is gradually risen.

When the output voltage VOUT comes not lower than a voltage level VBB+VTN, then the fourth transistor Q4 turns ON or comes into the conductive state, whereby the potential or the voltage level of the second node B2 is dropped to the voltage level VBB. As a result, the third transistor Q3 comes into the non-conductive state or turn OFF. At this time, the output voltage VOUT is risen to the voltage level VPP and the second and tenth transistors Q2 and Q10 remain OFF state or the non-conductive state whilst the first and fifth transistors Q1 and Q5 remain ON state or the conductive state.

Subsequently, the fall-operation of the output voltage VOUT will be described as follows.

When the input voltage VIN is in the voltage level VINT, then the first node B1 has the ground level GND and the second node B2 has the voltage level VBB and further the output terminal VOUT has the voltage level VPP. The transistors Q2, Q3, Q6 and Q10 are in the non-conductive states or OFF state, whilst the remaining transistors Q1, Q4, Q5 and Q12 are in the conductive state or ON state whereby the individual nodes are connected to the power voltages.

When the input voltage VIN becomes not higher than the voltage level VINT−|VTP|, the sixth transistor Q6 having the gate receiving the input voltage VIN turns ON or comes into the conductive state, whereby the potential of the second node B2 is risen to the voltage level VINT. When the input voltage VIN becomes the ground level GND and the potential of the second node B2 becomes not lower than a voltage level GND−VTN, then the twelfth transistor Q12 turns OFF or comes into the non-conductive state.

When the input voltage VIN becomes not higher than the voltage level VTN, the fifth transistor Q5 having the gate receiving the input voltage VIN turns OFF or comes into the non-conductive state, and further if the input voltage VIN becomes the ground level GND, then the tenth transistor Q10 having the gate connected to the input terminal VIN turns ON or comes into the conductive state, whereby the potential of the first node B1 is risen to approach the voltage level VINT–|VTP|. Since at this time the source and drain voltage of the tenth transistor Q10 is reduced, then the driving ability of the tenth transistor Q10 is dropped whereby the potential or the voltage level of the first node B1 is gradually risen.

When the potential or the voltage level of the second node B2 comes not lower than a voltage level VBB+VTN, then the third transistor Q3 turns ON or comes into the conductive state.

When the output voltage VOUT comes not higher than a voltage level VPP–|VTP|, then the second transistor Q2 turns ON or comes into the conductive state, whereby the potential or the voltage level of the first node B1 is risen to the voltage level VPP. As a result, the first transistor Q1 comes into the non-conductive state or turn OFF. At this time, the output voltage VOUT is dropped to the voltage level VBB and the fourth and twelfth transistors Q4 and Q12 remain OFF state or the non-conductive state whilst the third and sixth transistors Q3 and Q6 remain ON state or the conductive state.

Figure 8:
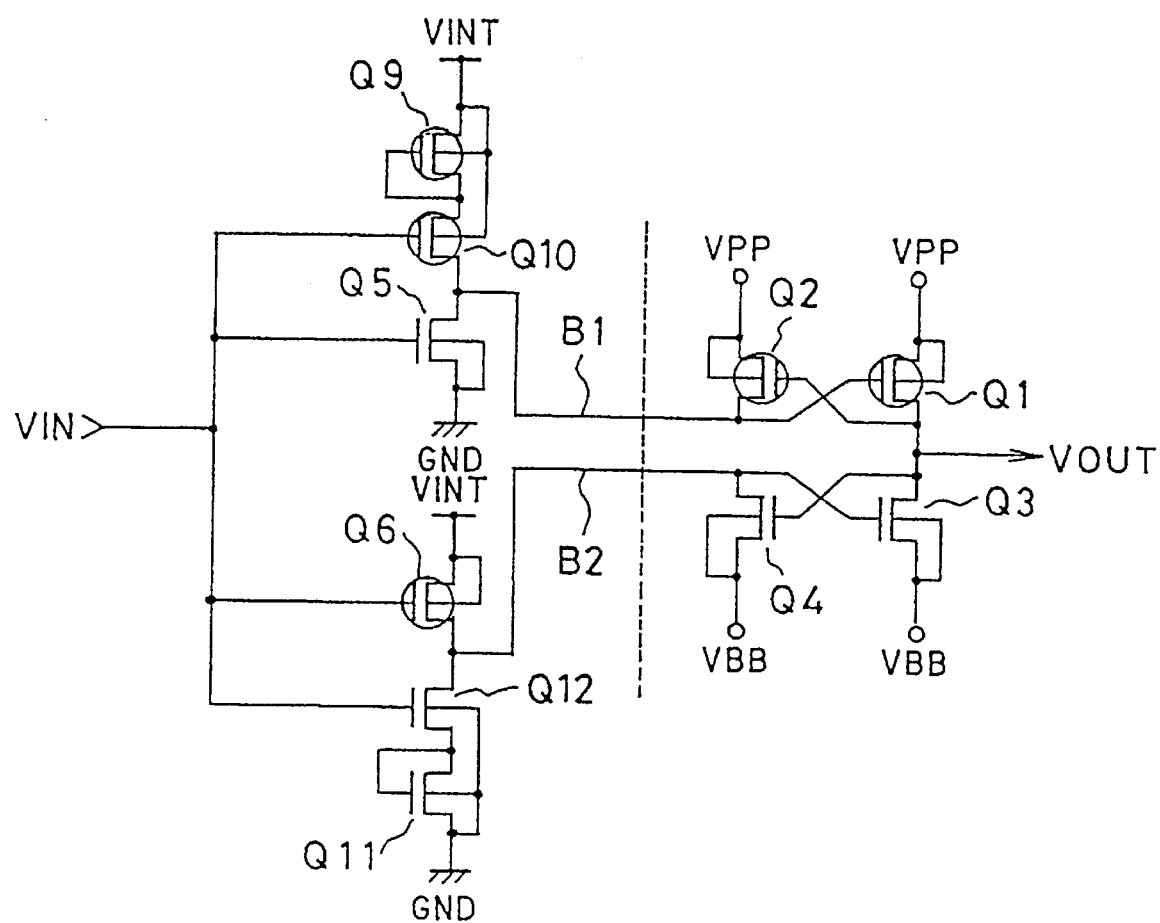
FIG. 8 which is a circuit diagram illustrative of a novel level converter circuit capable of exhibiting a high speed logic voltage level conversion operations in a fourth embodiment in accordance with the present invention.

In the above novel level converter circuit illustrated in FIG. 8, the ninth transistor Q9 is provided for preventing the conduction between the high power voltage line VPP and the internal power voltage line VINT. Further, the eleventh transistor Q11 is provided for preventing the conduction between the ground line GND and the low power voltage line VBB. As a result, the gate of the first transistor Q1 on the driver section is controlled or driven by a CMOS inverter circuit comprising the fifth and tenth transistors Q5 and Q10. The gate of the third transistor Q3 on the driver section is controlled or driven by another CMOS inverter circuit comprising the sixth and twelfth transistors Q6 and Q12. Those circuit configuration causes the high speed changes in potentials of the first and second nodes B1 and B2, whereby the level converter circuit of this embodiment is capable of executing high speed voltage level conversion operations.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An input section for a voltage level converter circuit that converts high and low original voltages to high and low converted voltages, respectively, the voltage level converter circuit having an input terminal connected to said input section and a driver section that is connected to said input section and that has driver transistors connected to an output terminal, said input section comprising:

an inverter having an input connected to the input terminal;

a first set of plural transistors that are connected in series between the high converted voltage and the low original voltage, a first transistor of said first set of transistors having a gate connected to the input terminal and a second transistor of said first set of transistors having a gate connected to an output of said inverter, said first set of transistors driving one of the driver transistors; and a second set of plural transistors that are connected in series between the high original voltage and the low converted voltage, a first transistor of said second set of transistors having a gate connected to the input terminal and a second transistor of said second set of transistors having a gate connected to the output of said inverter, said second set of transistors driving another one of the driver transistors.

2. The input section of claim 1, wherein said first set of transistors comprises two NMOS transistors that each has a substrate connected to the low original voltage and said second set of transistors comprises two PMOS transistors that each has a substrate connected to the high original voltage.

3. An input section for a voltage level converter circuit that converts high and low original voltages to high and low converted voltages, respectively, the voltage level converter circuit having an input terminal connected to said input section and a driver section that is connected to said input section and that has driver transistors connected to an output terminal, said input section comprising:

an inverter having an input connected to the input terminal;

a first set of plural transistors that are connected in series between an output of said inverter and the low original voltage, a first transistor of said first set of transistors having a gate connected to the high original voltage and a second transistor of said first set of transistors having a gate connected to the input terminal, said first set of transistors driving one of the driver transistors; and a second set of plural transistors that are connected in series between the high original voltage and the output of said inverter, a first transistor of said second set of transistors having a gate connected to the input terminal and a second transistor of said second set of transistors having a gate connected to the low original voltage, said second set of transistors driving another one of the driver transistors.

4. The input section of claim 3, wherein said first set of transistors comprises two NMOS transistors that each has a substrate connected to the low original voltage and said second set of transistors comprises two PMOS transistors that each has a substrate connected to the high original voltage.

5. An input section for a voltage level converter circuit that converts high and low original voltages to high and low converted voltages, respectively, the voltage level converter circuit having an input terminal connected to said input section and a driver section that is connected to said input section and that has driver transistors connected to an output terminal, said input section comprising:

a first transistor connected to the high original voltage;

a first CMOS inverter connected between the first transistor and the low original voltage, said first CMOS inverter having gates connected to the input terminal, said first CMOS inverter driving one of the driver transistors;

a second transistor connected to the low original voltage; and a second CMOS inverter connected between the second transistor and the high original voltage, said second CMOS inverter having gates connected to the input terminal, said second CMOS inverter driving another one of the driver transistors.

6. The input section of claim 5, wherein said first CMOS inverter comprises an NMOS transistor with a substrate connected to low original voltage and a PMOS transistor with a substrate connected to the high original voltage, and said second CMOS inverter comprises an NMOS transistor with a substrate connected to low original voltage and a PMOS transistor with a substrate connected to the high original voltage.

7. The input section of claim 6, wherein said first transistor is a PMOS transistor with a substrate connected to the high original voltage and said second transistor is an NMOS transistor with a substrate connected to the low original voltage.

* * * * *